(12) United States Patent
Crain et al.

(10) Patent No.: US 8,634,509 B2
(45) Date of Patent: Jan. 21, 2014

(54) SYNCHRONIZED CLOCK PHASE INTERPOLATOR

(75) Inventors: Ethan Crain, Nashua, NH (US); Thomas F. Hummel, Natick, MA (US); Thucydides Xanthopoulos, Watertown, MA (US); Scott Meninger, Groton, MA (US)

(73) Assignee: Cavium, Inc., San Jose, CA (US)

( * ) Notice: Subject to any disclaimer, the term of this patent is extended or adjusted under 35 U.S.C. 154(b) by 64 days.

(21) Appl. No.: 13/397,303

(22) Filed: Feb. 15, 2012

(65) Prior Publication Data

US 2012/0207259 A1  Aug. 16, 2012

Related U.S. Application Data

(60) Provisional application No. 61/442,976, filed on Feb. 15, 2011.

(51) Int. Cl.
*H04L 7/00* (2006.01)

(52) U.S. Cl.
USPC .......................................................... 375/355

(58) Field of Classification Search
USPC .......................................................... 375/355
See application file for complete search history.

(56) References Cited

U.S. PATENT DOCUMENTS

| | | | |
|---|---|---|---|
| 6,956,923 B1* | 10/2005 | Younis et al. | 375/375 |
| 2007/0047683 A1* | 3/2007 | Okamura et al. | 375/355 |
| 2010/0097071 A1* | 4/2010 | Lee et al. | 324/537 |
| 2010/0182049 A1* | 7/2010 | Sjoland | 327/7 |

* cited by examiner

*Primary Examiner* — Chieh M Fan
*Assistant Examiner* — Tanmay Shah
(74) *Attorney, Agent, or Firm* — Hamilton, Brook, Smith & Reynolds, P.C.

(57) ABSTRACT

A high-linearity Phase Interpolator based Clock and Data Recovery (CDR) circuit for use in a multi-standard Serializer/Deserializer (SerDes) is provided. By interpolating at a high, fixed frequency for all supported data rates and then dividing the output clock down to the appropriately frequency for each standard, the Phase Interpolator can provide for maximum phase linearity while reducing its sensitivity to noise.

10 Claims, 7 Drawing Sheets

SYNCHRONIZED CLOCK PHASE INTERPOLATOR

RELATED APPLICATION

This application claims the benefit of U.S. Provisional Application No. 61/442,976, filed on Feb. 15, 2011. The entire teachings of the above application are incorporated herein by reference.

BACKGROUND

Phase interpolation is a method of increasing the resolution of the clock and data recovery (CDR) clock beyond the native resolution of the input clock phase spacing. By taking a programmable, linear combination of the input phases, Phase Interpolators can be used to generate an arbitrary number of intermediate phases between each of the input phases. Finer resolution of the intermediate phases leads to lower deterministic jitter in the serial data link.

SUMMARY

A high-linearity Phase Interpolator based Clock and Data Recovery (CDR) circuit for use in a multi-standard Serializer/Deserializer (SerDes) interpolates at a high, fixed frequency for all supported data rates and then divides the output clock down to the appropriate frequency for each standard, for maximum phase linearity while reducing its sensitivity to noise.

Embodiments of the invention provide a clock and data recovery (CDR) circuit, which includes an interpolator circuit that receives a clock signal from a phase-locked loop and outputs a clock pair. A divider receives the clock pair and outputs a divided clock pair. A pair of latches clocks a received data signal based on the divided clock pair. Further, a pair of deserializers receives latched data signals from the pair of latches. A finite state machine is connected to the outputs of the pair of deserializers, and controls the interpolator based on the deserializer output to adjust the clock pair. The interpolator circuit may generate the clock pair to have a frequency matching the frequency of the clock signal.

In further embodiments, a method of recovering clock and data signals from an incoming serial data stream utilizes a clock and data recovery (CDR) circuit and a reference clock generated by a variable oscillator. A clock signal is generated using a phase interpolator operating at a fixed frequency using a reference clock input and state information from a finite state machine (FSM). A divided, recovered clock is generated with a frequency divider configured to receive the generated clock from the phase interpolator for latching the input data. The data input is then latched using the generated recovered clock. The data latched by the in-phase clock is then compared against the data latched by the quadrature clock at the FSM, and the FSM generates an updated phase interpolator state signal based on the difference between the latched outputs. Based on the phase interpolator state signal, the phase and frequency of the recovered clock generated by the phase interpolator is adjusted such that the latches clocked by the quadrature clock sample the input data at the center of the data eye to provide the correct recovered data. As a result of the adjustment, the FSM is provided with updated phase and frequency information.

In further embodiments, adjusting the phase and frequency causes the latches clocked by the in-phase clock to sample the input data at the data eye crossings. Further, the sample input data may provide an indication of early and late edge information, the FSM receiving the information.

In still further embodiments, a CDR circuit may include an interpolator circuit that receives a clock signal from a phase-locked loop and outputs a clock pair. A divider receives the clock pair and outputs a divided clock pair, the divide clock pair having first and second clock signals. A pair of latches clocks a received data signal based on the divided clock pair, the first pair of latches being clocked by respective rising and falling edges of the first clock signal, the second pair of latches being clocked by respective rising and falling edge of the second clock signal. Further, a pair of deserializers receives latched data signals from the pair of latches. A finite state machine is connected to the outputs of the pair of deserializers, and controls the interpolator based on the deserializer output to adjust the clock pair. The interpolator circuit may generate the clock pair to have a frequency matching the frequency of the clock signal.

In still further embodiments, the first clock signal may be a quadrature clock signal and the second clock signal may be an in-phase clock signal. The first pair of latches may be configured to latch the input data at a center of a data eye, and the second pair of latches may be configured to latch the input data at a data eye crossing. The first pair of latches may output a recovered data signal, and the second pair of latches may indicate early and late edge information.

In yet further embodiments, the divider is configured to output the divided clock pair having a frequency that is half a frequency of the received data signal.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Phase interpolation is a method of increasing the resolution of the CDR clock beyond the native resolution of the input clock phase spacing. By taking a programmable, linear combination of the input phases, Phase Interpolators can be used to generate an arbitrary number of intermediate phases between each of the input phases. Finer resolution of the intermediate phases leads to lower deterministic jitter in the serial data link. To first order, the transfer function of a typical phase interpolator is:

$$Ph_{out}=(1-\alpha)\cdot Ph_0+\alpha\cdot Ph_1$$

where $Ph_{out}$ is the output phase and $\alpha$ is the weighting factor (0:1) between the two input phases, $Ph_0$ and $Ph_1$.

Figure 1:
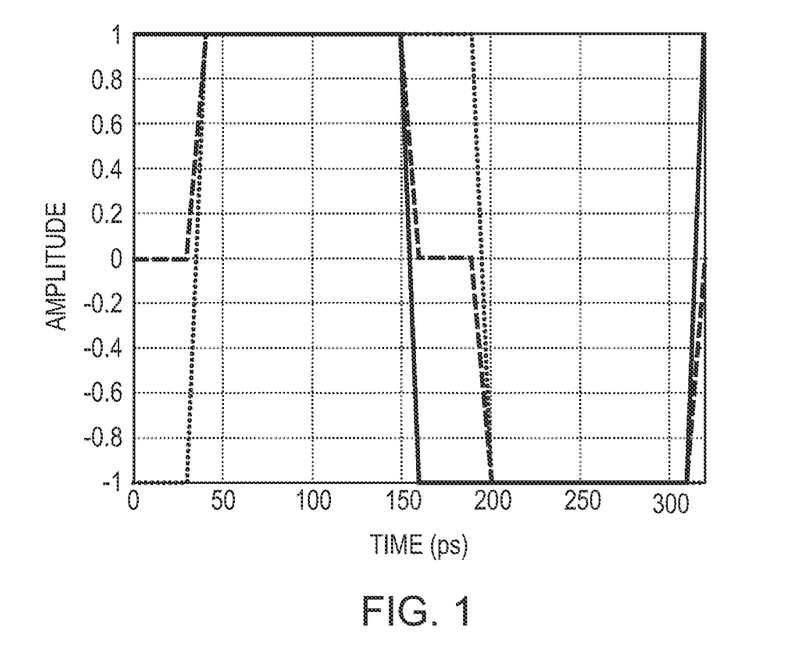
FIG. 1 is a signal diagram of phase interpolation of a square wave.

FIG. 1 is a signal diagram of phase interpolation of a square wave. Among other factors, the linearity of the phase interpolator output is dependent on the edge rate of the input phases relative to the spacing between adjacent input phases. If the edge rate of the input phases is very high relative to the phase spacing, then there is little overlap between the two input phases and the output of the interpolator will be very non-linear. FIG. 1 demonstrates that fast edge rates, relative to the input phase spacing, cause non-overlapping input phases (solid blue and red lines) and generate a very non-linear, and potentially non-monotonic, output (dashed green line). Non-monotonicity in the phase interpolator transfer function means that the output is not either strictly increasing or decreasing for all steps in the code. Non-monotonicity in the Phase Interpolator transfer function will cause catastrophic failures in the CDR.

Figure 2:
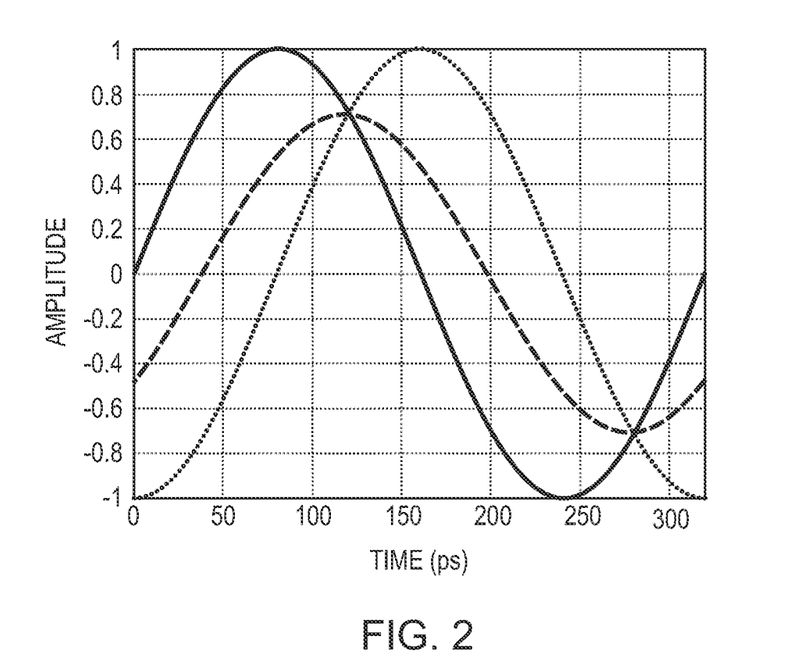
FIG. 2 is a signal diagram of phase interpolation of a sine wave.

FIG. 2 is a signal diagram of phase interpolation of a sine wave. As the edge rate decreases at a given input frequency, resulting in more overlap of the input phases, the phase interpolator output becomes more linear. FIG. 2 demonstrates the result of interpolating with two quadrature sine waves (solid blue and red lines). Quadrature signals are 90 degrees out of phase so that there are four (4) evenly spaced phases per clock period. The output phase (dashed green line) is a monotonic, linear combination of the input phases. It is clear from FIGS. 1 and 2 that slower edge rates relative to the input frequency are critical to achieve a linear phase interpolator transfer function. Interpolation with sine waves produces an ideally linear output phase.

Figure 3:
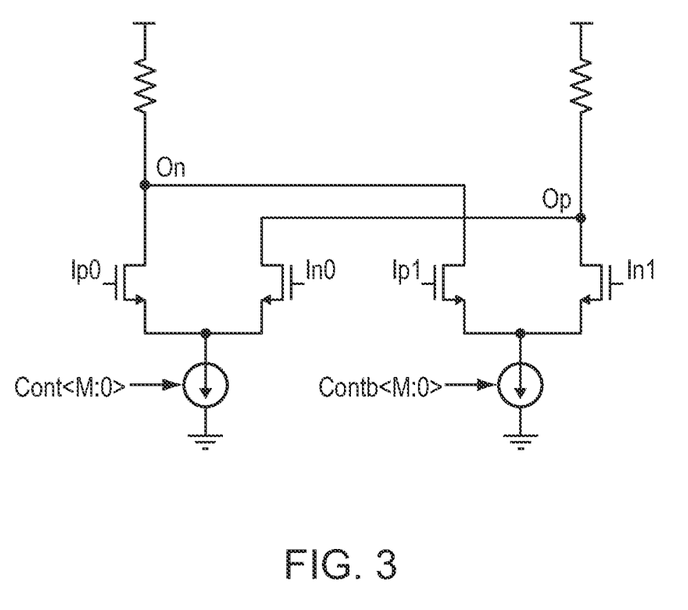
FIG. 3 is a schematic diagram of an interpolator circuit.

FIG. 3 is a schematic diagram of an interpolator circuit, being a common-mode logic (CML)-based phase interpolator with current DAC control. To demonstrate the impact of clock frequency and edge rate on linearity, the performance of the CML based Phase Interpolator shown in FIG. 3 may be simulated with a 3.125 GHz input clock and then again with a 2.5 GHz input clock. The interpolator input nodes Ip0/In0 and Ip1/In1 are the two differential input phase pairs and nets Op/On are the interpolated differential output phase. The weighting between the two input phase pairs is controlled through the current DAC tail current sources. The current DAC is implemented as an M+1 bit thermometer encoded current DAC but could also be binary weighted. No changes are made to either the clock reference, except changing the frequency, or the Phase Interpolator between the two sets of measurements—specifically, the input clock edge rates are the same in both cases. The linearity of the phase interpolator can be measured in terms of both the Integral Non-Linearity (INL) and Differential Non-Linearity (DNL). INL is the deviation of each point in the code space from the ideal value for the given code and DNL is the deviation of the amplitude of each step relative to the ideal step, or 1 Least Significant Bit (LSB).

Figure 4:
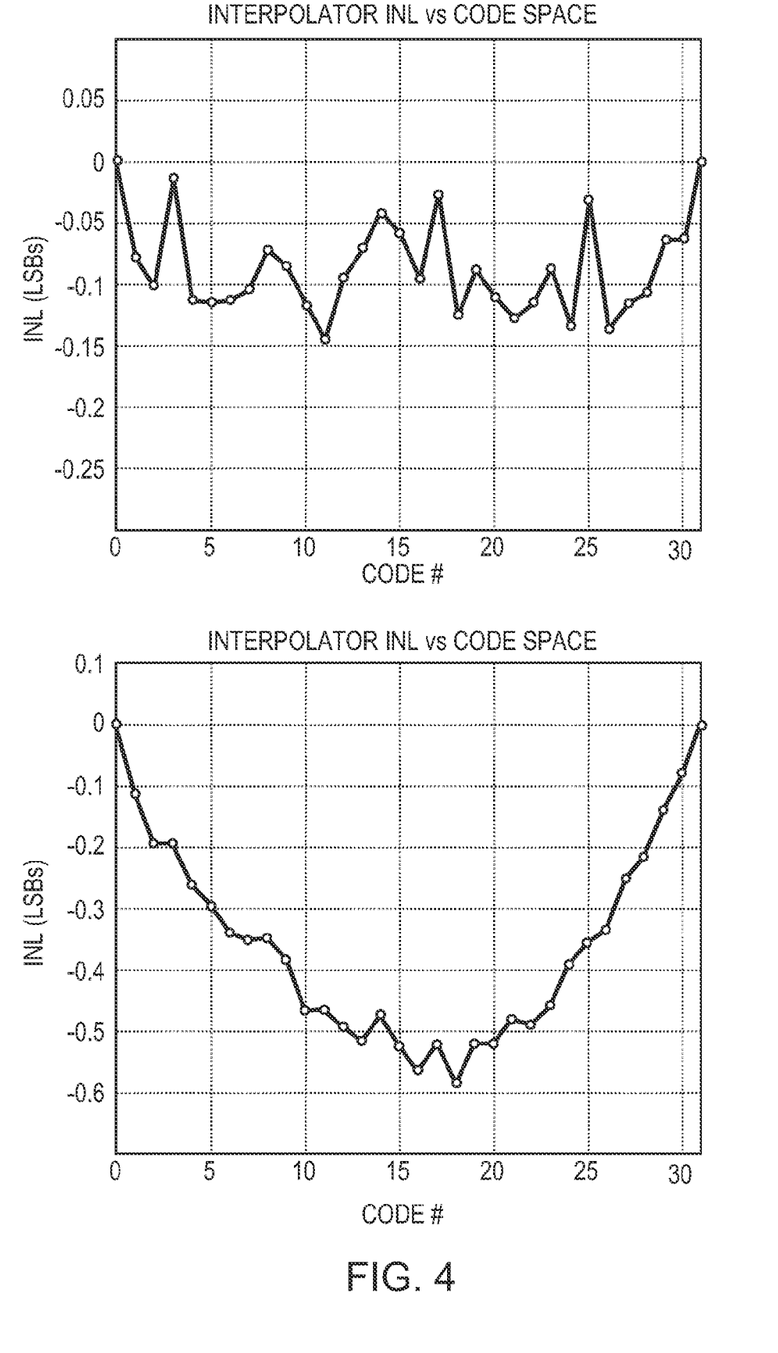
FIG. 4 is a graph illustrating the Integral Non-Linearity (INL) of a phase interpolator.

FIG. 4 is a graph illustrating the Integral Non-Linearity (INL) of a phase interpolator. The graph exhibits the INL of the a Phase Interpolator with 8 phases per clock period running at 3.125 GHz, on the top, and at 2.5 GHz, on the bottom. Again, the edge-rates of the input phases are the same for each case. At 3.125 GHz, the worst case INL is −0.15 LSBs while at 2.5 GHz the worst case INL increases to −0.60 LSBs. The INL is always zero (0) at the minimum and maximum code. For a given Phase Interpolator design, simply lowering the input frequency by 20% increases the INL by approximately 4×.

Figure 5:
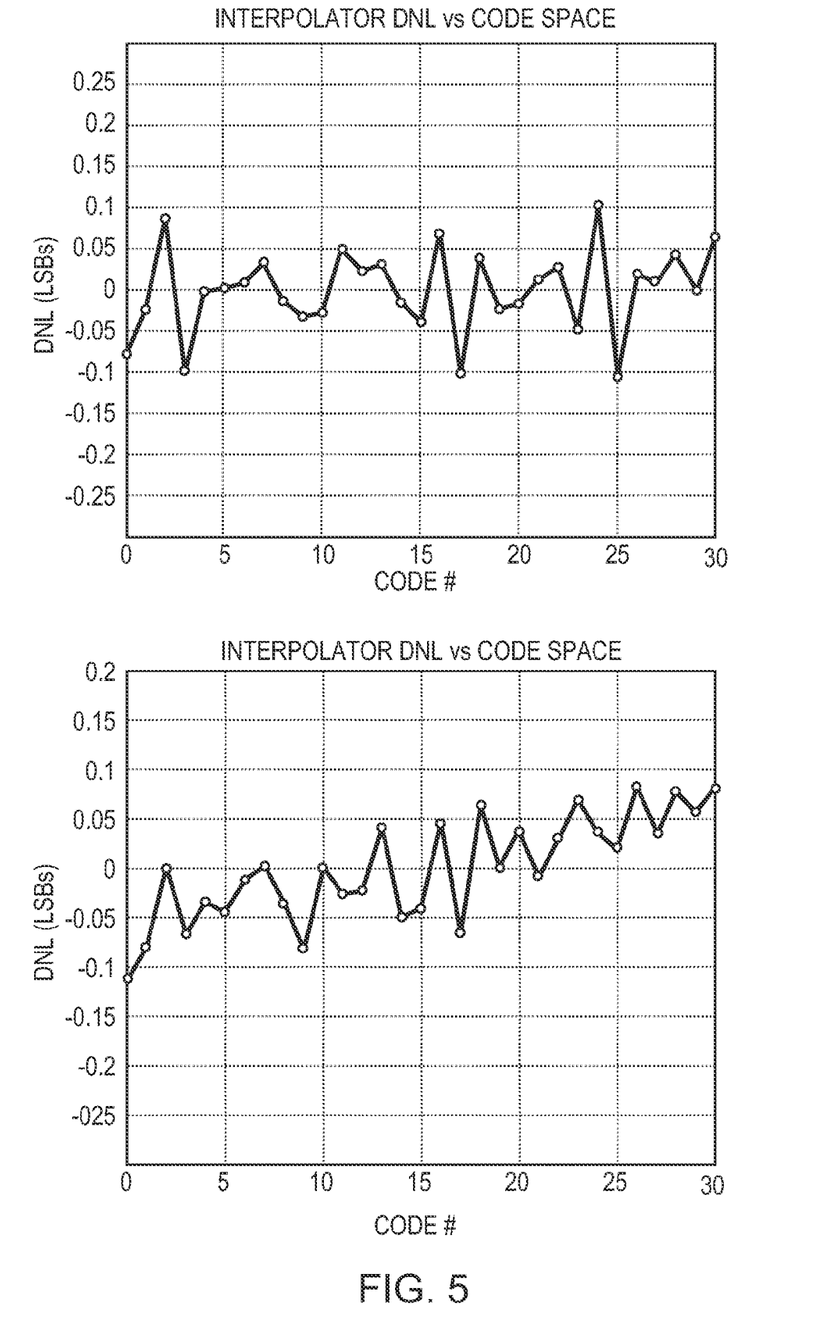
FIG. 5 is a graph illustrating the Differential Non-Linearity (DNL) of a phase interpolator.

FIG. 5 is a graph illustrating the Differential Non-Linearity (DNL) of a phase interpolator, running at 3.125 GHz (left) and 2.5 GHz (right). Similar to FIG. 4, FIG. 5 exhibits the DNL of the same Phase Interpolator design for the same conditions. Although the amplitude of the worst case DNL is similar at the two frequencies, the DNL at 2.5 GHz is code dependent, resulting in the worse INL shown in FIG. 4, while the DNL at 3.125 GHz varies randomly across the code space.

Reducing the edge-rate of the Phase Interpolator input phases is a common approach to improving the linearity of the Phase Interpolator as the frequency of the input phases is decreased to accommodate multiple SerDes standards. However, the trade-off to this approach is that it increases the sensitivity of the Phase Interpolator to noise sources such as intrinsic device noise and supply noise increasing the jitter of the interpolated output phase. As in the linearity analysis above, the interpolator input clock phases may be sine waves in order to provide the best intrinsic linearity at each operating frequency. To demonstrate the impact of noise on the Phase Interpolator, inject an impulse at a peak of the input phase and observe the impact on the output.

Figure 6:
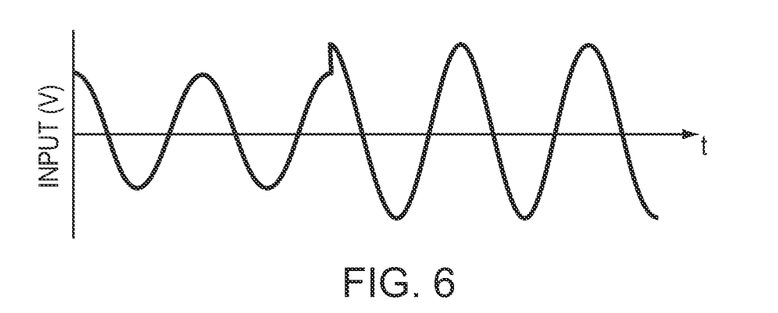
FIG. 6 is a signal diagram illustrating noise injection.

FIG. 6 is a signal diagram illustrating noise injection when input phase signal is at peak value. The resulting waveform demonstrates that, although the amplitude of the input signal is impacted, the zero-crossings of the input phase remain unchanged.

Figure 7:
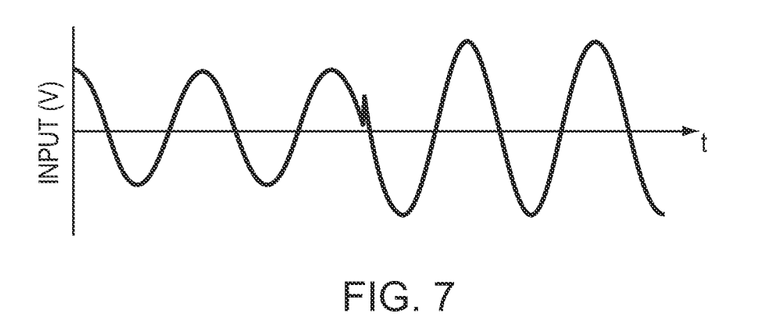
FIG. 7 is a signal diagram illustrating noise injection.

However, if the injected noise occurs at a zero-crossing of the input signal, as shown in FIG. 7, then both the amplitude and the zero-crossing of the input signal are disturbed and the shift in the zero-crossing is inversely proportional to the slope, or edge-rate. The input signal can be described as:

$$V_{in}=A\cdot\sin(2\pi f\cdot t)$$

and the slope can be quantified as:

$$\frac{\delta(V_{in})}{\delta t} = \frac{\delta(A\cdot\sin(2\pi f\cdot t))}{\delta t} = 2\pi fA\cdot\cos(2\pi f\cdot t)$$

where A is the amplitude, f is the frequency and t is time. If the input amplitude A=1 and the input frequency f=3.125 GHz, then the slope at the zero-crossing is 2πf=19.6 GV/s. For a 10 mV noise impulse this translates to a 509 fs deviation in the zero-crossing (10 mV/19.6 GV/s).

Figure 8:
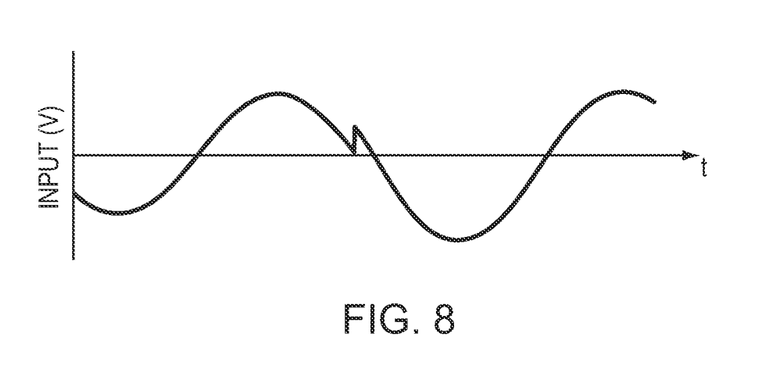
FIG. 8 is a signal diagram illustrating noise injection.

FIG. 8 is a signal diagram illustrating noise injection at a zero-crossing of input phase signal at half the frequency. If, as in FIG. 8, the frequency of the input signal is halved then the slope equals 9.8 GV/s at the zero-crossing and the same 10 mV noise impulse translates to a 1018 fs (~1 ps) deviation in the zero-crossing. The magnitude of jitter due to noise injected at the zero-crossing of the input phase, such as supply noise, scales linearly with interpolator input phase frequency assuming sine wave inputs. Therefore, for noise insensitivity, it is desirable to have the fastest input phase edge rates possible, which translates to interpolating at the highest frequency possible.

Figure 9:
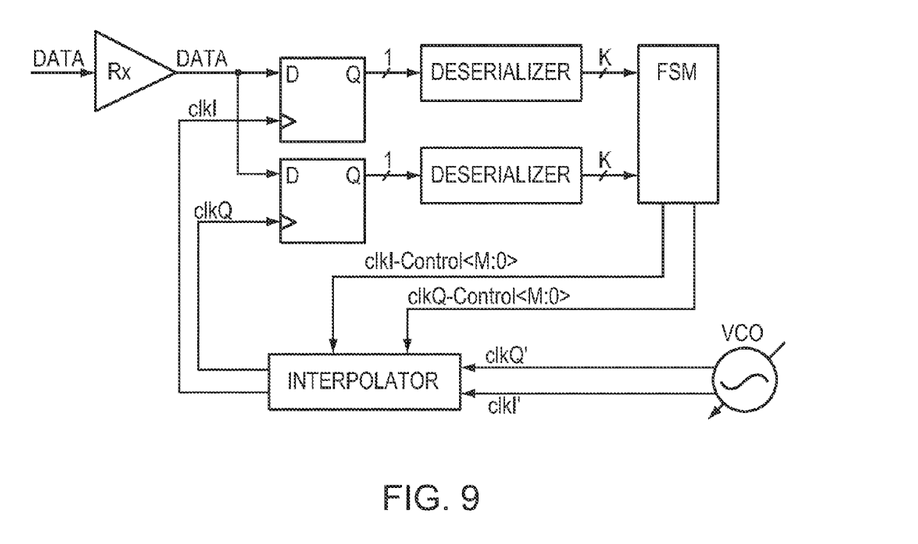
FIG. 9 is a block diagram of a typical CDR system.

FIG. 9 is a block diagram of a typical CDR system, which does not include a divider. The standard approach to implementing a Phase Interpolating DLL-based CDR in prior art adjusts the frequency of the phase interpolator input phases based on the incoming data-rate one of several ways. The first method, shown in FIG. 9, is to run the PLL at a lower frequency and slow down the edge-rates of the Phase Interpolator input phases to achieve acceptable linearity in the Phase Interpolator output. However, this approach suffers from two major problems. The first issue is that the Interpolator Inputs are susceptible to noise injection because of the slow edge-rates. Secondly, PLLs typically have a limited frequency range over which it can operate limiting the practicality of this approach for multi-standard SerDes designs.

Figure 10:
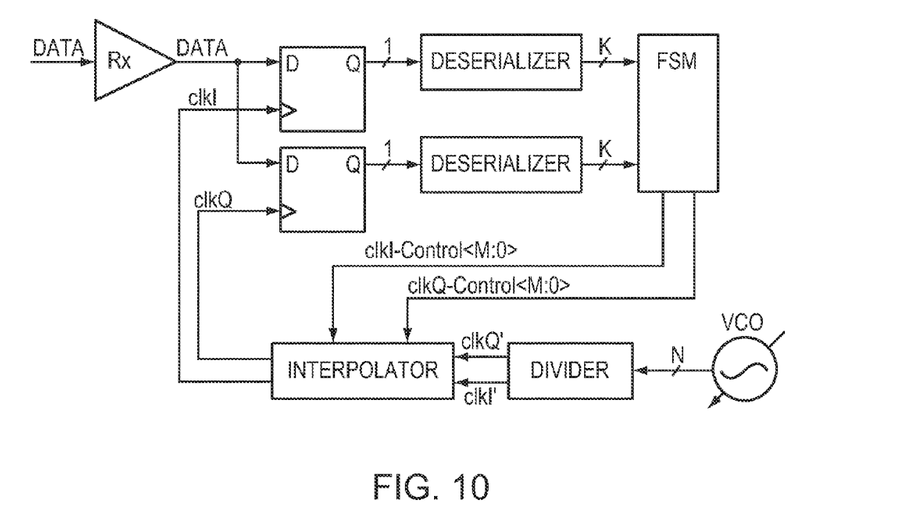
FIG. 10 is a block diagram of a typical CDR system with a divider.

FIG. 10 is a block diagram of a typical CDR system utilizing a divider at the VCO output. A more common approach to adjusting the frequency of the phase interpolator input, pictured in FIG. 10, is to divide the PLL output down to the required frequency prior to the Phase Interpolator and to again slow down the divider outputs to achieve acceptable linearity in the Phase Interpolator. Depending on the individual design parameters, this approach suffers from either degraded Phase Interpolator linearity if the edge-rates of the input phases are unchanged or an elevated sensitivity to noise if the edge-rates are lowered to achieve better linearity. Using any of the aforementioned design topologies leads to a fundamental trade-off between linearity and noise immunity.

Further, additional phases to the PLL may be added to avoid the need to slow down the edge-rates of the Phase Interpolator inputs and then divide the PLL output frequency prior to the Phase Interpolator. However, increasing the number PLL output phases adds power and complexity to the design.

Figure 11:
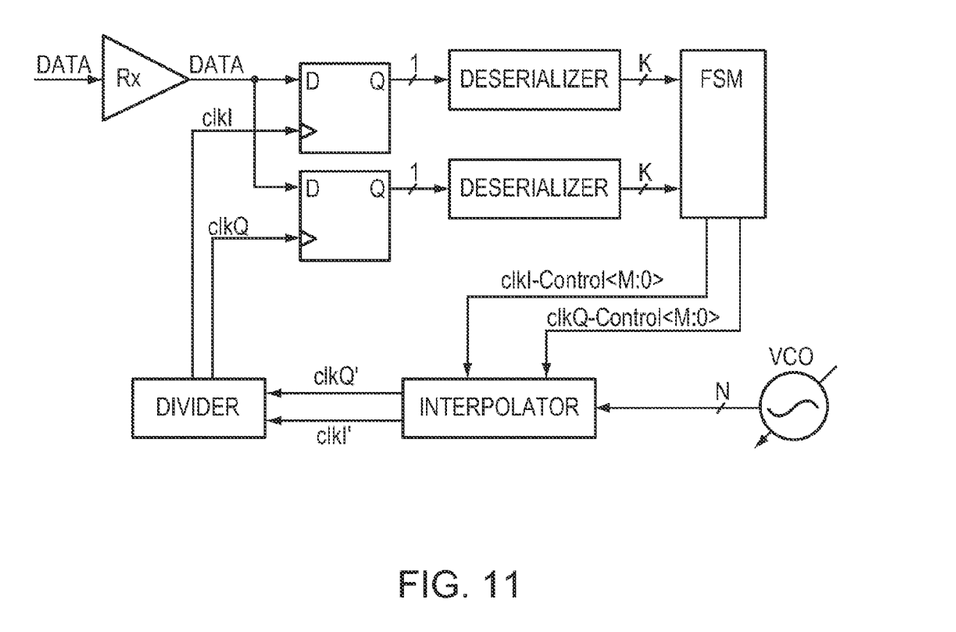
FIG. 11 is a block diagram of a CDR system in an example embodiment.

FIG. 11 is a block diagram of a CDR system in an example embodiment. Here, a divider is configured at the output of the Phase Interpolator block. Because both interpolation and frequency scaling of the Phase Interpolator input phases are linear operations, configuring the CDR in this manner does not alter the overall system transfer function. This configuration enables a low-power and simple PLL design because the PLL operates over a small frequency range—the range is determined by the set of divider values and the supported SerDes standards. Additionally, both the Phase Interpolator input edge-rates and interpolator core design can be optimized for a single (or small range) of operating frequencies to maximize the linearity and limit the noise immunity of the output.

To keep the loop dynamics of the CDR consistent when the data rate and the clock divider value change, the FSM may adjust the interpolator gain and the offset between the in-phase and quadrature clocks for each data rate. Both the interpolator gain and offset terms are referenced to 1 LSB of the interpolator, which is constant for all data rates, while the loop dynamics are referenced to the bit period (UI) at each data rate. For example, if the data rate changes from 5 Gbd to 2.5 Gbd, both the gain and offset terms may be doubled.

A critical component enabling the constant speed interpolation is the reset synchronizer. The reset signals for the divider following the Phase Interpolator must be synchronized to ensure the proper phase relationship between the in-phase and quadrature (recovered) clock signals. An in-phase clock is one where the clock edge is aligned with the data, where a quadrature clock is ¼ of a clock cycle away from a data transition in a DDR (dual data rate) system. The synchronizer accommodates any phase offset between the in-phase and quadrature clock between 0 and 360 degrees.

While this invention has been particularly shown and described with references to example embodiments thereof, it will be understood by those skilled in the art that various changes in form and details may be made therein without departing from the scope of the invention encompassed by the appended claims.

What is claimed is:

1. A clock and data recovery (CDR) circuit comprising:
an interpolator circuit configured to receive a clock signal from a phase-locked loop and output a clock pair, the clock pair having a frequency matching a frequency of the clock signal including an in-phase signal and a quadrature-phase signal;
a divider configured to receive the clock pair and output a divided clock pair;
a pair of latches configured to clock a received data signal based on the divided clock pair;
a pair of deserializers configured to receive latched data signals from the pair of latches; and
a finite state machine connected to the outputs of the pair of deserializers, the finite state machine configured to compare the data latched by the in-phase clock signal against the data latched by the quadrature clock signal and to control the interpolator based on the comparison.

2. A method of recovering clock and data signals from an incoming serial data stream using a clock and data recovery (CDR) circuit and a reference clock generated by a variable oscillator, the method comprising:
generating a clock signal using a phase interpolator based on the reference clock and state information from a finite state machine (FSM), the phase interpolator operating at a fixed frequency;
generating a divided clock signal from the clock signal, the divided clock signal including an in-phase clock signal and a quadrature clock signal;
latching the data input according to the divided clock signal;
comparing the data latched by the in-phase clock signal against the data latched by the quadrature clock signal;
generating an updated phase interpolator state signal based on the comparison;
adjusting, via the phase interpolator state signal, phase and frequency of the recovered clock generated by the phase interpolator such that the latches clocked by the quadrature clock sample the input data at the center of the data eye; and
providing the FSM with updated phase and frequency information.

3. The method of claim 2, wherein adjusting the phase and frequency causes the latches clocked by the in-phase clock to sample the input data at the data eye crossings.

4. The method of claim 3, wherein the sample input data provides an indication of early and late edge information, the FSM receiving the information.

5. A clock and data recovery (CDR) circuit comprising:
an interpolator circuit configured to receive a clock signal from a phase-locked loop and output a clock pair;
a divider configured to receive the clock pair and output a divided clock pair, the divided clock pair having first and second clock signals;
a first and second pair of latches configured to clock a received data signal based on the divided clock pair, the first pair of latches being clocked by respective rising and falling edges of the first clock signal, the second pair of latches being clocked by respective rising and falling edge of the second clock signal;
a pair of deserializers configured to receive latched data signals from the pair of latches; and
a finite state machine connected to the outputs of the pair of deserializers, the finite state machine configured to compare the data latched by the first clock signal against the data latched by the second clock signal and to control the interpolator based on the comparison.

6. The circuit of claim 5, wherein the first clock signal is a quadrature clock signal and the second clock signal is an in-phase clock signal.

7. The circuit of claim 6, wherein the first pair of latches are configured to latch the input data at a center of a data eye, and wherein the second pair of latches are configured to latch the input data at a data eye crossing.

8. The circuit of claim 7, wherein the first pair of latches output a recovered data signal, and wherein the second pair of latches indicate early and late edge information.

9. The circuit of claim 5, wherein the divider is configured to output the divided clock pair having a frequency that is half a frequency of the received data signal.

10. The circuit of claim 5, wherein the interpolator circuit is further configured to output the clock pair having a frequency matching a frequency of the clock signal.

\* \* \* \* \*